US012660513B2

(12) United States Patent
Aseev

(10) Patent No.: US 12,660,513 B2
(45) Date of Patent: Jun. 16, 2026

(54) SEMICONDUCTOR DEVICE AND METHODS FOR FABRICATING AND OPERATING THE DEVICE

(71) Applicant: Microsoft Technology Licensing, LLC, Redmond, WA (US)

(72) Inventor: Pavel Aseev, Rijswijk (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 442 days.

(21) Appl. No.: 18/554,168

(22) PCT Filed: Apr. 29, 2021

(86) PCT No.: PCT/EP2021/061237
§ 371 (c)(1),
(2) Date: Oct. 5, 2023

(87) PCT Pub. No.: WO2022/228678
PCT Pub. Date: Nov. 3, 2022

(65) Prior Publication Data
US 2024/0224816 A1     Jul. 4, 2024

(51) Int. Cl.
*H10N 60/10* (2023.01)
*H10N 60/01* (2023.01)

(52) U.S. Cl.
CPC ............. *H10N 60/10* (2023.02); *H10N 60/01* (2023.02)

(58) Field of Classification Search
None
See application file for complete search history.

(56) References Cited

U.S. PATENT DOCUMENTS

| | | | |
|---|---|---|---|
| 5,241,190 A | 8/1993 | Eisenstein et al. | |
| 11,444,184 B1 * | 9/2022 | Tahan | H01L 21/26513 |
| 2002/0179897 A1 | 12/2002 | Eriksson | |
| 2009/0279355 A1 * | 11/2009 | Rakshit | H10B 10/00 |
| | | | 365/185.01 |
| 2018/0053809 A1 | 2/2018 | Freedman et al. | |

(Continued)

FOREIGN PATENT DOCUMENTS

| | | |
|---|---|---|
| WO | 2021110274 A1 | 6/2021 |
| WO | 2021197590 A1 | 10/2021 |

OTHER PUBLICATIONS

"Aluminium Indium Arsenide", Retrieved From: https://en.wikipedia.org/w/index.php?title=Aluminium_indium_arsenide&oldid=985517749, Oct. 26, 2020, 1 Page.

(Continued)

*Primary Examiner* — Alexander G Ghyka
(74) *Attorney, Agent, or Firm* — Alleman Hall LLP

(57) ABSTRACT

A semiconductor device comprises a crystalline substrate and a nanowire arranged epitaxially on the crystalline substrate. The nanowire comprises: a gating layer arranged over the substrate, a quantum well arranged over the gating layer, an intermediate barrier arranged between the gating layer and the quantum well, and an upper barrier arranged over the quantum well. By incorporating a gating layer into the nanowire, bottom gating of the quantum well is made possible without requiring the substrate to incorporate the bottom gate. Also provided are a method of operating the semiconductor device, and a method of fabricating the semiconductor device.

20 Claims, 3 Drawing Sheets

(56) References Cited

U.S. PATENT DOCUMENTS

| | | | |
|---|---|---|---|
| 2020/0027030 A1 | 1/2020 | Freedman et al. | |
| 2020/0227636 A1* | 7/2020 | Krogstrup Jeppesen | ................... |
| | | | H10N 50/85 |
| 2020/0235276 A1* | 7/2020 | Aseev | .................. H10N 60/128 |
| 2021/0126181 A1* | 4/2021 | Winkler | ................. H10N 60/84 |
| 2021/0143310 A1* | 5/2021 | Holmes | .................. H10N 69/00 |
| 2021/0175408 A1* | 6/2021 | Gardner | ................. H10N 60/10 |
| 2022/0044142 A1* | 2/2022 | Posske | .................. G06N 10/40 |
| 2022/0216884 A1* | 7/2022 | Delfosse | ............ H03M 13/1111 |

OTHER PUBLICATIONS

"Multigate Device", Retrieved From: https://en.wikipedia.org/w/index.php?title=Multigate_device&oldid=993067547, Dec. 8, 2020, 10 Pages.

"Quantum Well", Retrieved From: https://en.wikipedia.org/w/index.php?title=Quantum_well&oldid=1011001859, Mar. 8, 2021, 11 Pages.

"Spin Qubit Quantum Computer", Retrieved From: https://en.wikipedia.org/w/index.php?title=Spin_qubit_quantum_computer&oldid=1002494105, Jan. 24, 2021, 3 Pages.

Casparis, et al., "Superconducting Gatemon Qubit based on a Proximitized Two-Dimensional Electron Gas", In Repository of arXiv:1711.07665v3, Dec. 8, 2017, 6 Pages.

Fox, et al., "Quantum Wells, Superlattices and Band-Gap Engineering", Published in Springer Handbook of Electronic and Photonic Materials, Oct. 4, 2017, pp. 1037-1057.

Lee, et al., "Transport Studies Of Epi-Al/Inas Two-Dimensional Electron Gas Systems for Required Building-Blocks in Topological Superconductor Networks", In Journal of Nano Letters, vol. 19, Issue 5, Mar. 26, 2019, pp. 3083-3090.

Lei, et al., "Quantum Transport in High-Quality Shallow InSb Quantum Wells", In Repository of arXiv:1904.00828v1, Apr. 1, 2019, 4 Pages.

Odoh, et al., "A Review of Semiconductor Quantum Well Devices", In Journal of Advances in Physics Theories and Applications, vol. 46, 2015, pp. 26-32.

Ooike, et al., "Fabrication of GaAs Nanowire Devices with Self-aligning W-Gate Electrodes using Selective-Area MOVPE", In Journal of Thin Solid Films, vols. 464-465, Oct. 1, 2004, pp. 220-224.

Pauka, et al., "Repairing the Surface of InAs-based Topological Heterostructures", In Repository of arXiv:1908.08689v1, Aug. 23, 2019, 7 Pages.

"International Search Report and Written Opinion Issued in PCT Application No. PCT/EP21/061237", Mailed Date: Apr. 13, 2022, 19 Pages.

"Invitation to Pay Additional Fee Issued in PCT Application No. PCT/EP21/061237", Mailed Date: Feb. 23, 2022, 12 Pages.

Renk, Karlf. , "GaAs Quantum Well Laser.", Published in book Basics of Laser Physics, Mar. 31, 2017, pp. 457-474.

Wang, et al., "Electrical Modulation of Weak-Antilocalization and Spin-Orbit Interaction in Dual Gated Ge/Si Core/Shell Nanowires", In Journal of Semiconductor Science and Technology vol. 32, Issue 9, Aug. 9, 2017, 12 Pages.

Notice Of Allowance Received for Japan Application No. 2023-562512, mailed on Jul. 29, 2025, 11 pages. (English Translation Provided).

Office Action Received for Korean Application No. 10-2023-7036615, mailed on Aug. 26, 2025, 06 pages. (English Translation Provided).

Cheah, et al., "Control over epitaxy and the role of the InAs/Al interface in hybrid two-dimensional electron gas systems", arXiv:2301.06795v1, Jan. 17, 2023, 23 pages.

Lee, et al., "Transport studies of epi-Al/InAs 2DEG systems for required building-blocks in topological superconductor networks", arXiv:1705.05049v1, May 15, 2017, 16 pages.

Lei, et al., "Quantum transport in high-quality shallow InSb quantum wells", arXiv:1904.00828v2, Jun. 25, 2019, 5 pages.

Office Action Received for Japanese Application No. 2023-562512, mailed on Apr. 1, 2025, 03 pages. (English Translation Not Found).

Office Action Received for Korean Application No. 10-2023-7036615, mailed on Jan. 31, 2025, 09 pages. (English Translation Provided).

* cited by examiner

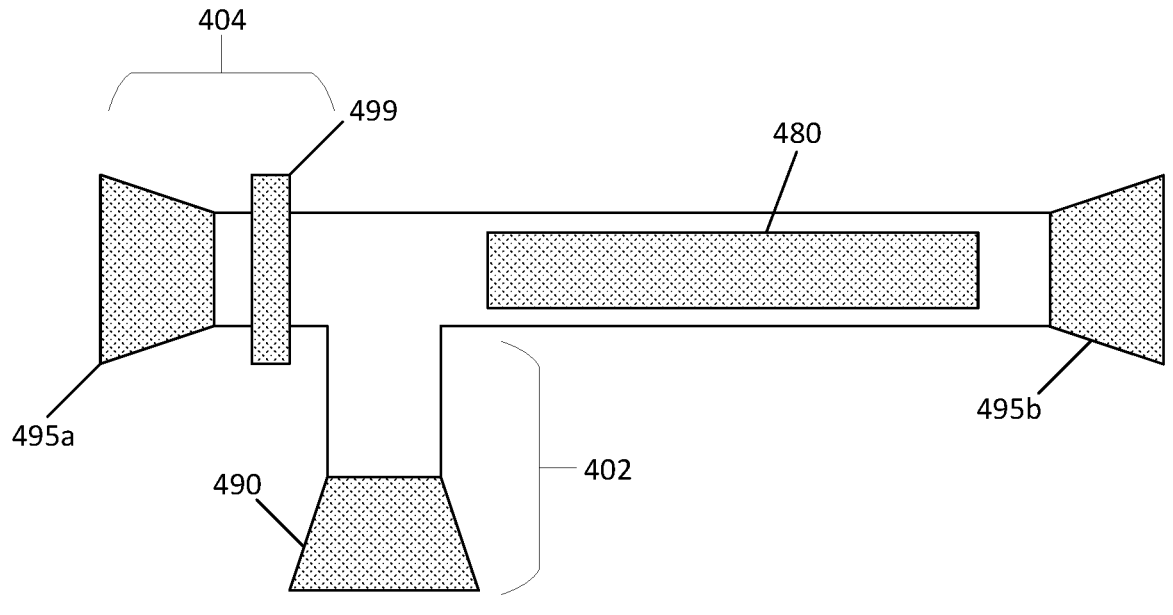

Fig. 5

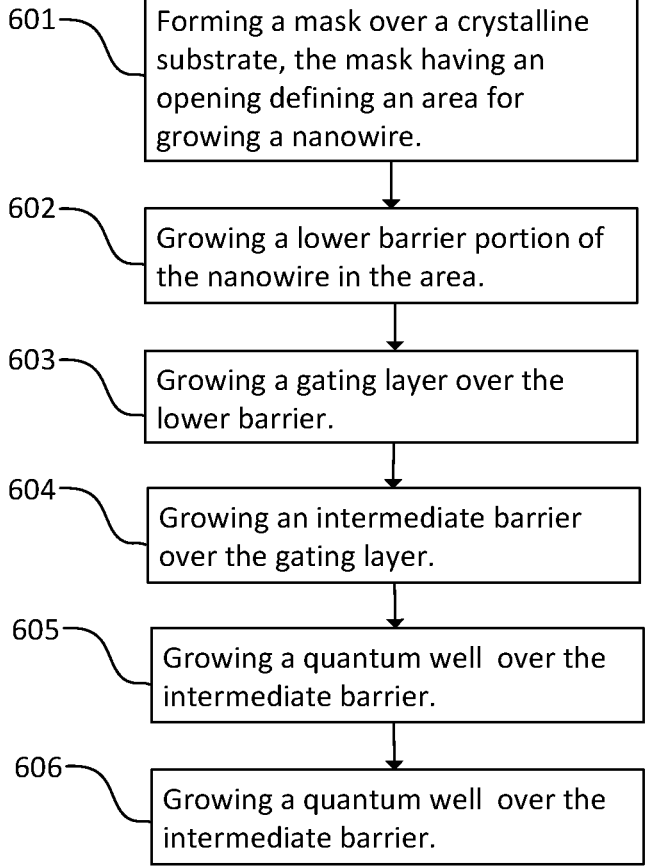

601 — Forming a mask over a crystalline substrate, the mask having an opening defining an area for growing a nanowire.

602 — Growing a lower barrier portion of the nanowire in the area.

603 — Growing a gating layer over the lower barrier.

604 — Growing an intermediate barrier over the gating layer.

605 — Growing a quantum well over the intermediate barrier.

606 — Growing a quantum well over the intermediate barrier.

Fig. 6

SEMICONDUCTOR DEVICE AND METHODS FOR FABRICATING AND OPERATING THE DEVICE

CROSS REFERENCE TO RELATED APPLICATIONS

The present application is a U.S. National Phase of International Patent Application Serial No. PCT/EP2021/061237 entitled "SEMICONDUCTOR DEVICE AND METHODS FOR FABRICATING AND OPERATING THE DEVICE", filed Apr. 29, 2021, the entire contents of which are hereby incorporated by reference for all purposes.

BACKGROUND

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to a temperature that induces superconducting behaviour in the superconductor material. It may also involve gating a part of the nanowire with an electrostatic potential.

By forming a network of such nanowires and inducing the topological regime in parts of the network, it is possible to create a quantum bit which can be manipulated for the purpose of quantum computing. A quantum bit, also referred to as a qubit, is an element upon which a measurement with two possible outcomes can be performed, but which at any given time (when not being measured) can in fact be in a quantum superposition of the two states corresponding to the different outcomes.

To induce an MZM, the device is cooled to a temperature where the superconductor (e.g. Aluminium, Al) exhibits superconducting behaviour. The superconductor causes a proximity effect in the adjacent semiconductor, whereby a region of the semiconductor near the interface with the superconductor also exhibits superconducting properties. I.e. a topological phase behaviour is induced in the adjacent semiconductor as well as the superconductor. It is in this region of the semiconductor where the MZMs are formed.

Another condition for inducing the topological phase where MZMs can form is the application of a magnetic field in order to lift the spin degeneracy in the semiconductor. Degeneracy in the context of a quantum system refers to the case where different quantum states have the same energy level. Lifting the degeneracy means causing such states to adopt different energy levels. Spin degeneracy refers to the case where different spin states have the same energy level. Spin degeneracy can be lifted by means of a magnetic field, causing an energy level spilt between the differently spin-polarized electrons. This is known as the Zeeman effect. Typically, the magnetic field is applied by an external electromagnet. However, U.S. Ser. No. 16/246,287 has also disclosed a heterostructure in which a layer of a ferromagnetic insulator is disposed between the superconductor and semiconductor in order to internally apply the magnetic field for lifting the spin degeneracy, without the need for an external magnet. Examples given for the ferromagnetic insulator included compounds of heavy elements in the form of EuS, GdN, $Y_3Fe_5O_{12}$, $Bi_3Fe_5O_{12}$, $YFeO_3$, $Fe_2O_3$, $Fe_3O_4$, GdN, $Sr_2CrReO_6$, $CrBr_3/CrI_3$, $YTiO_3$ (the heavy elements being Europium, Gadolinium, Yttrium, Iron, Strontium and Rhenium).

Inducing MZMs typically also requires gating the nanowire with an electrostatic potential. The electrostatic potential is applied using a gate electrode. Applying an electrostatic potential manipulates the number of charge carriers in the conductance band or valence band of the semiconductor component.

SUMMARY

In one aspect, the present invention provides a semiconductor device. The semiconductor device comprises a crystalline substrate and a nanowire arranged epitaxially on the crystalline substrate. The nanowire comprises a gating layer arranged over the substrate, a quantum well arranged over the gating layer, an intermediate barrier arranged between the gating layer and the quantum well, and an upper barrier arranged over the quantum well. By incorporating a gating layer into the nanowire, bottom gating of the quantum well is made possible without requiring the substrate to incorporate the bottom gate.

A related aspect provides a method of operating the semiconductor device. The method comprises applying an electrostatic potential to the gating layer, whereby the gating layer acts as a gate electrode for gating the quantum well.

Another aspect provides the use of a semiconductor layer to gate a quantum well, wherein the semiconductor layer is under the quantum well, and an intermediate barrier is present between the semiconductor layer and the quantum well, the intermediate barrier comprising a layer of a further semiconductor. The semiconductor layer, quantum well, and intermediate barrier may each be components of a nanowire. The use may be in the context of a device as described herein.

In a still further aspect, the present invention provides a method of fabricating a semiconductor device. The method comprises forming a mask over a crystalline substrate, the mask having an opening defining an area for growing a nanowire; and subsequently growing a nanowire epitaxially on the crystalline substrate in the area. Growing the nanowire comprises: growing a lower barrier over the substrate, growing a gating layer over the lower barrier, growing an intermediate barrier over the gating layer, growing a quantum well over the intermediate barrier; and growing an upper barrier over the quantum well.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which:

FIG. 5 is a plan view of the FIG. 4 device; and

FIG. 6 is a flow chart outlining a method of fabricating a semiconductor device.

Figure 1:
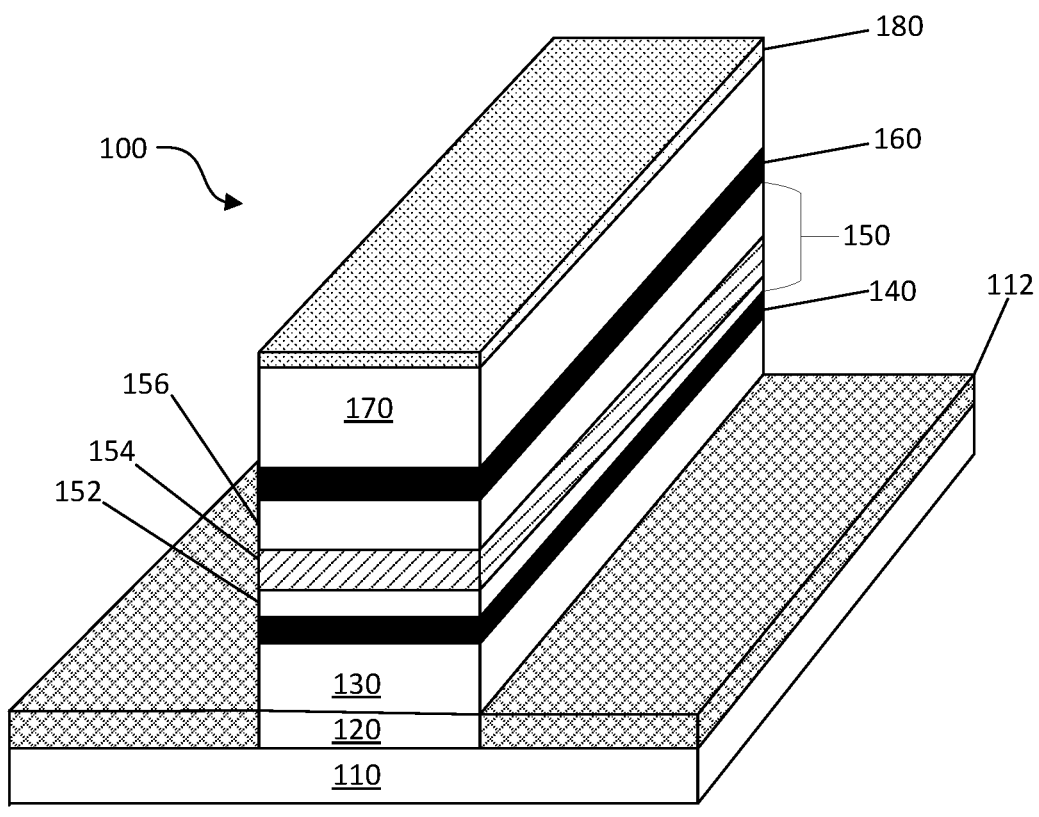
FIG. 1 is a schematic perspective view of an example semiconductor device.

The drawings are schematic and are not to scale.

DETAILED DESCRIPTION OF EMBODIMENTS

The verb 'to comprise' is used herein as shorthand for 'to include or to consist of'. In other words, although the verb 'to comprise' is intended to be an open term, the replacement of this term with the closed term 'to consist of' is explicitly contemplated, particularly where used in connection with chemical compositions.

Directional terms such as "top", "bottom", "left", "right", "above", "below", "horizontal" and "vertical" are used herein for convenience of description and relate to the orientation shown in the relevant drawing. For the avoidance of any doubt, this terminology is not intended to limit the orientation of the device in an external frame of reference.

As used herein, the term "superconductor" refers to a material which becomes superconductive when cooled to a temperature below a critical temperature, Tc, of the material. The use of this term is not intended to limit the temperature of the device.

A "nanowire" is an elongate member having a nano-scale width, and a length-to-width ratio of at least 10, at least 100, or at least 500, or at least 1000. A nanowire typically has a width in the range 10 to 500 nm, optionally 50 to 100 nm or 75 to 125 nm. Lengths are typically of the order of micrometres, e.g. at least 1 μm, or at least 10 μm. For example, a nanowire may have a length in the range 2 to 20 μm and a width in the range 40 to 200 nm A "semiconductor-superconductor hybrid structure" comprises a semiconductor component and a superconductor component which may become coupled to one another under certain operating conditions. In particular, this term refers to a structure capable of showing topological behaviour such as Majorana zero modes, or other excitations useful for quantum computing applications. The operating conditions generally comprise cooling the structure to a temperature below the Tc of the superconductor component, applying a magnetic field to the structure, and applying electrostatic gating to the structure. Generally, at least part of the semiconductor component is in intimate contact with the superconductor component, for example the superconductor component may be epitaxially grown on the semiconductor component. Certain device structures having one or more further components between the semiconductor component and superconductor component have however been proposed.

Various approaches have been taken to gating semiconductor devices. It would be particularly useful to provide a bottom-gated device.

Implementing bottom gating for a vapour-liquid-solid, VLS, grown nanowire is relatively straightforward. To fabricate a device which includes VLS nanowires, the nanowires are first grown on a growth substrate. The nanowires produced by VLS are vertically orientated: their length axis is perpendicular to the plane of the growth substrate. The nanowires are then cleaved from the growth substrate, and placed in a horizontal orientation on a device substrate. Bottom gate electrodes, e.g. in the form of a patterned metal layer, may be formed in advance on the device substrate before adding the nanowires.

Devices based on VLS nanowires have limited scalability because of the requirement to cleave the nanowires from the growth substrate. Positioning the nanowires is a delicate, time-consuming process and quickly becomes impractical as the complexity of the device increases.

Another approach to fabricating nanowires is selective area growth. Selective area growth involves the use of a mask to allow crystalline semiconductor to be grown selectively in an area defined by openings in the mask. Selective area growth forms horizontally-orientated nanowires, which are grown directly on the device substrate. No cleaving or transferring is therefore performed. This may allow relatively complex networks of nanowires to be produced.

The bottom gating of selective-area-grown nanowires is challenging. One approach is to configure the substrate as a bottom gate, for example by forming a conductive buffer layer across the surface of the substrate before forming the mask. Although this approach allows bottom gating to be achieved, it has limitations. The conductive buffer layer limits the possible circuit designs. Further, since the mask is formed after forming the conductive buffer layer, charge traps may be created between the nanowire and the buffer layer. This may negatively impact on the performance of the device.

Provided herein are semiconductor devices which integrate a bottom gate into a selective-area-grown nanowire while allowing for the use of an insulating substrate. The devices may be useful as components of qubit devices in particular, but are also applicable in other contexts where it may be desired to bottom-gate a quantum well.

An example semiconductor device 100 will now be explained with reference to FIG. 1. The device comprises a nanowire arranged on a substrate 110. FIG. 1 is a schematic perspective view of the device 100.

The device 100 includes a substrate 110. The substrate comprises a wafer, i.e. a piece of single crystalline material. One example wafer material is indium phosphide. Other examples of wafer materials include gallium arsenide, indium antimonide, indium arsenide, and silicon.

The substrate may consist of the wafer. Alternatively, the substrate may be a functionalized wafer, further comprising additional structures such as integrated electrical circuits.

Arranged on the wafer is a dielectric mask 112. The nanowires provided herein may be fabricated using selective area growth. Selective area growth makes use of a mask 112 to control the location at which epitaxial growth of a component takes place. The mask 112 may comprise any material which provides selectivity during growth, and in particular may comprise an amorphous dielectric material. The component may be grown using a technique such as molecular beam epitaxy ("MBE"), metal-organic vapor phase epitaxy ("MOVPE"), or the like. The mask 112 is typically not removed after growing the component, and therefore remains present in the finished device. Examples of dielectric materials useful for forming masks include silicon oxides, $SiO_x$, silicon nitrites, $SiN_x$, aluminium oxides, $AlO_x$, and hafnium oxides, $HfO_x$.

A nanowire, which in this example is a nanowire obtainable by selective area growth (also referred to as a "SAG nanowire"), extends from the surface of the substrate 110 through an opening in the dielectric mask 112. The nanowire is horizontally orientated. In other words, the length dimension of the nanowire is parallel to the surface of the substrate. The relative height of the nanowire shown in FIG. 1 is exaggerated.

The nanowire comprises a plurality of layers, and includes a gating layer 140 and a quantum well 160 arranged in a sandwich structure further comprising barrier layers 130, 150, 170. The quantum well 160 is the active region of the device: in use, quantum excitations of interest are generated in this layer. The gating layer 140 serves as a bottom gate for the quantum well 160.

By incorporating a bottom gate into the SAG nanowire itself, as opposed to the substrate, design constraints would be imposed by incorporating a bottom gate into the substrate are lifted. As one example, the substrate may be an insulating substrate, thereby allowing electrical circuits to be formed on the substrate. This may allow the semiconductor device to be incorporated into a wider range of systems.

The nature of the gating layer 140 is not particularly limited provided that, when connected to a voltage source, the gating layer 140 is capable of providing an electrostatic field for gating the quantum well 160. The gating layer 140 may be a quantum well. Alternatively, the gating layer 140 may be semiconductor, in particular a doped semiconductor. Doped semiconductors have relatively high conductance compared to undoped semiconductors.

The various layers present in the example nanowire will now each be explained in turn.

The bottom layer of the example nanowire is an optional buffer layer 120. Buffer layer 120 is arranged epitaxially on the surface of the crystalline substrate 110. Since the nanowire is formed by epitaxial growth, good lattice matching between immediately adjacent layers of the nanowire is desirable. In other words, adjacent layers desirably have lattice constants which are as similar as possible. To this end, the buffer layer 120 may comprise a material which is selected to have a lattice constant between that of the crystalline substrate and that of the following layer, which in this example is lower barrier 130. Appropriate buffer layers may be provided between any two components of the device.

Arranged on top of buffer layer 120 is a lower barrier 130. The lower barrier is an insulating component which serves to localise charge within the gating layer 140. The lower barrier may comprise a layer of a single material, or a plurality of layers of two or more different materials. For example, the lower barrier may comprise an alternating stack of layers of two different materials. The number of such layers is not particularly limited.

The components of the nanowire may comprise III-V semiconductor materials, or II-VI semiconductor materials. A III-V semiconductor material may be a compound or alloy comprising at least one group III element selected from indium, aluminium and gallium; and at least one group V element selected from arsenic, phosphorous, and antimony.

The buffer layer and/or the lower barrier layer may, for example, each independently comprise materials of Formula 1:

$$Al_xIn_yGa_zAs$$

wherein values of x, y and z are independently selected, and are the range 0 to 1. x, y and z may sum to 1. The material may be selected from: indium arsenide, aluminium indium arsenide, indium gallium arsenide, aluminium gallium arsenide, and aluminium indium gallium arsenide.

The inclusion of a separate buffer layer is optional, and the lower barrier layer may be arranged directly on the surface of the substrate. The lower barrier layer may comprise two or more layers, comprising two or more different materials. Each material may be a material of Formula 1.

A gating layer 140 is arranged on the lower barrier 130 and is sandwiched between the lower barrier 130 and an intermediate barrier 150. The gating layer 140 comprises a layer of semiconductor material which has a relatively small band gap compared to those of the lower barrier 130 and intermediate barrier 150.

The gating layer 140 may comprise a material of formula 1. By varying the values of x, y and z, it is possible to control the electronic properties, in particular the band gap, of the material. For example, the barrier layers may comprise aluminium gallium arsenide and the quantum well layers may comprise gallium arsenide.

In use, gating layer 140 acts as a conductive layer, with charge being localised in the gating layer 140. This allows gating layer 140 to be operated as a gate electrode for gating the quantum well 160.

Arranged on the gating layer 140 is intermediate barrier 150. Like the lower barrier 130, the intermediate barrier 150 is an insulating component. Intermediate barrier 150 serves as a gate dielectric, for preventing flow of current between the gating layer 140 and the quantum well 160.

The intermediate barrier 150 may have a similar structure to the lower barrier 130 and may comprise one or more layers of relatively high band gap semiconductor material(s), e.g. materials of Formula 1.

In the illustrated example, intermediate barrier comprises a first layer 152, and second layer 154, and a third layer 156. Constructing a barrier from a plurality of layers may provide defect filtering, i.e. may reduce the effects of dislocations in the crystalline structure of the materials used.

Arranged on the intermediate barrier 150 is a quantum well 160. Quantum well 160 may comprise a layer of semiconductor material which has a relatively small band gap compared to those of the barriers. Materials useful for forming quantum wells are described in, for example, Odoh and Njapba, "A Review of Semiconductor Quantum Well Devices", Advances in Physics Theories and Applications, vol. 46, 2015, pp. 26-32; and S. Kasap, P. Capper (Eds.), "Springer Handbook of Electronic and Photonic Materials", DOI 10.1007/978-3-319-48933-9_40.

Quantum well 160 is the active, working component of the semiconductor device. In use, excitations of interest such as Majorana zero modes may be generated in the quantum well 160, with the gating layer 140 acting as a bottom gate for the quantum well 160.

In this example, an upper barrier 170 is arranged above the quantum well 160. Upper barrier 170 may be similar in construction to the lower and intermediate barriers 130, 150. Upper barrier 170 may comprise one or more layers of materials of Formula 1.

A superconductor component 180 is arranged on the upper barrier 170. The example device is configured as a semiconductor-superconductor hybrid device. In other words, the superconductor component 180 may be configured to undergo energy level hybridisation with the quantum well 160 with the material of the quantum well 160. The upper barrier 170 may serve to adjust the strength of the interaction between the quantum well 160 and the superconductor component 180.

The nature of the superconductor, where present, is not particularly limited and may be selected as appropriate. The superconductor is typically an s-wave superconductor. Any of the various s-wave superconductors known in the art may be used. Examples include aluminium, indium, tin, and lead, with aluminium being preferred in some contexts. In implementations where aluminium is used, the superconductor component may for example have a thickness in the range 3 to 20 nm.

Various modifications may be made to the illustrated structure. For example, the upper barrier 170 is optional and may be omitted. The superconductor component 180 may be omitted. The device may include more than one quantum well. The device may include more than one gating layer. For example, superconductor component 180 could be replaced by a further gating layer configured to act as a top gate.

Figure 2:
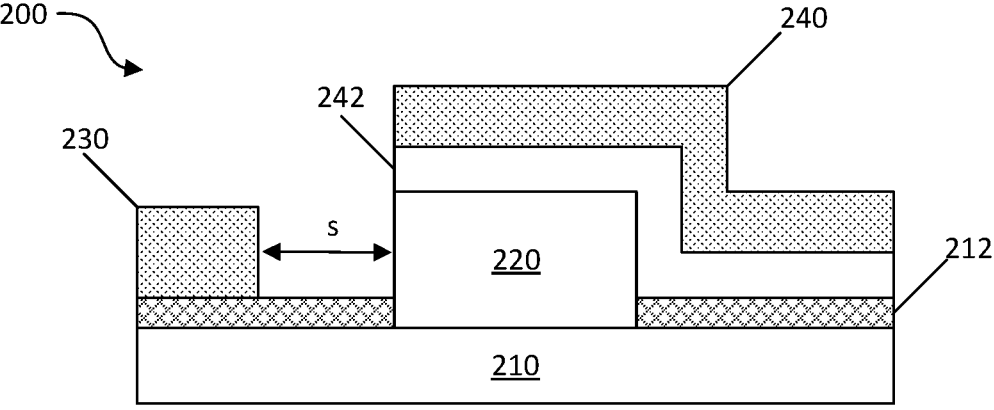
FIG. 2 shows illustrative arrangements of gate electrodes for semiconductor devices.

The bottom gating provided by the first quantum well 140 may be used in combination with other forms of gating. Different parts of the device may be differently gated, to allow finer control over the device's behaviour. Example configurations for additional gate electrodes for the semiconductor devices described herein will now be discussed with reference to FIG. 2. FIG. 2 is a simplified schematic cross-section of an illustrative device.

In general, a structure for providing gating comprises a gate electrode and a gate dielectric for prevent flow of current between the gate electrode and further components of the device. Such a structure may be referred to as a gate stack.

FIG. 2 shows an example device 200, which includes a dielectric mask 212, semiconductor device 220 and substrate 210 as described with reference to FIG. 1. Details of the semiconductor device 220 are omitted from the drawing for clarity of representation. The device 200 differs from device 100 in that it is side-gated and top-gated.

Side-gating is provided by side gate 230. Side gate 230 is an electrode which is spaced laterally from the semiconductor device 220 by a space S. The space serves as a gate dielectric between the side gate 230 and the semiconductor device 220. The space S may be an empty space as illustrated, or a layer of a dielectric material may be provided in the space.

FIG. 2 further illustrates an example of a gate stack for a top gate. The gate stack includes a gate electrode 240 and a gate dielectric 242. The gate electrode 240 extends over the semiconductor device 220 and is separated from the semiconductor device 220 by the gate dielectric 242.

Examples of materials useful for forming gate dielectrics include aluminium oxides, hafnium oxides, silicon oxides and silicon nitrides. Although the gate dielectric 242 is illustrated as a single layer, two or more layers of dielectric material may be present.

If a superconductor component is arranged between the semiconductor component and the gate stack, then the superconductor component may screen the semiconductor component from the electrostatic field applied by the gate stack. Therefore, top- or side-gating is typically applied to a portion of the device which does not include a superconductor component. Alternatively, the top- or side-gate may be aligned with a face of the semiconductor component which does not bear the superconductor component.

The illustrated example includes a top gate and side gate. In practice, a device may include any number of gates, and the nature of each gate may be independently selected as appropriate.

Figure 3:
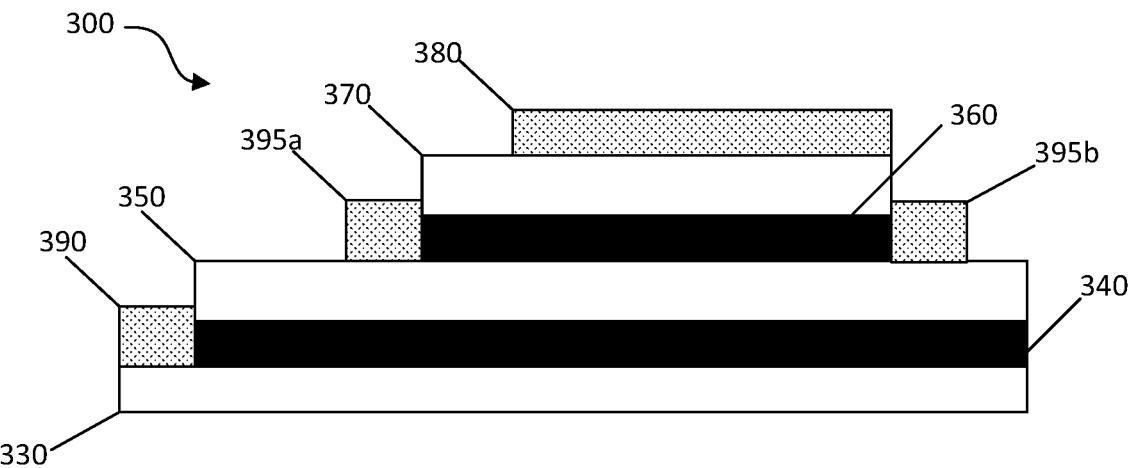
FIG. 3 is a side view of an example semiconductor device including a first example of a set of electrical contacts.

In use, the gating layer and the quantum well are each connected to respective electrical contacts. The electrical contacts may be arranged in various ways. A first example arrangement is shown in FIG. 3, which is a cross-section along the length of an example nanowire.

The example nanowire 300 includes a gating layer 340 and a quantum well 360. The gating layer 340 is sandwiched between a lower barrier 330 and an intermediate barrier 350. The quantum well 360 is sandwiched between the intermediate barrier 350 and an upper barrier 370. A superconductor component 380 is arranged above quantum well 360 and is spaced from the quantum well 360 by the upper barrier 370. The gating layer, quantum well, barriers, and superconductor component may be as previously described with reference to FIG. 1.

In an end region, the nanowire 300 connects to a first electrical contact 390 for the gating layer 340 and a second electrical contact 395 for the quantum well 360.

To avoid creating a short circuit, first electrical contact 390 and second electrical contact 395 are isolated from one another. In the illustrated example, a portion of the upper barrier layer 370 and quantum well 360 has been removed, for example by etching. The lower barrier 330, gating layer 340, and intermediate barrier 350 extend further than the upper barrier layer 370 and quantum well 360. This allows the first electrical contact 390 to be spaced laterally from the second electrical contact 395*a*.

Vertical separation between the first electrical contact 390 and second electrical contact 395*a* is provided by arranging the first electrical contact 390 on the lower barrier 330 and arranging the second electrical contact on the intermediate barrier 350.

The gating layer 340 is for applying an electrostatic field to the quantum well 360. The gating layer is therefore typically connected to only a single electrical contact 390. It is not necessary for a current to flow through the gating layer 340.

In contrast, it may be desirable to allow for a flow of current through the quantum well 360. The quantum well 360 therefore typically connects to a further electrical contact 395*b* arranged at a second end of the nanowire 300.

Figure 4:
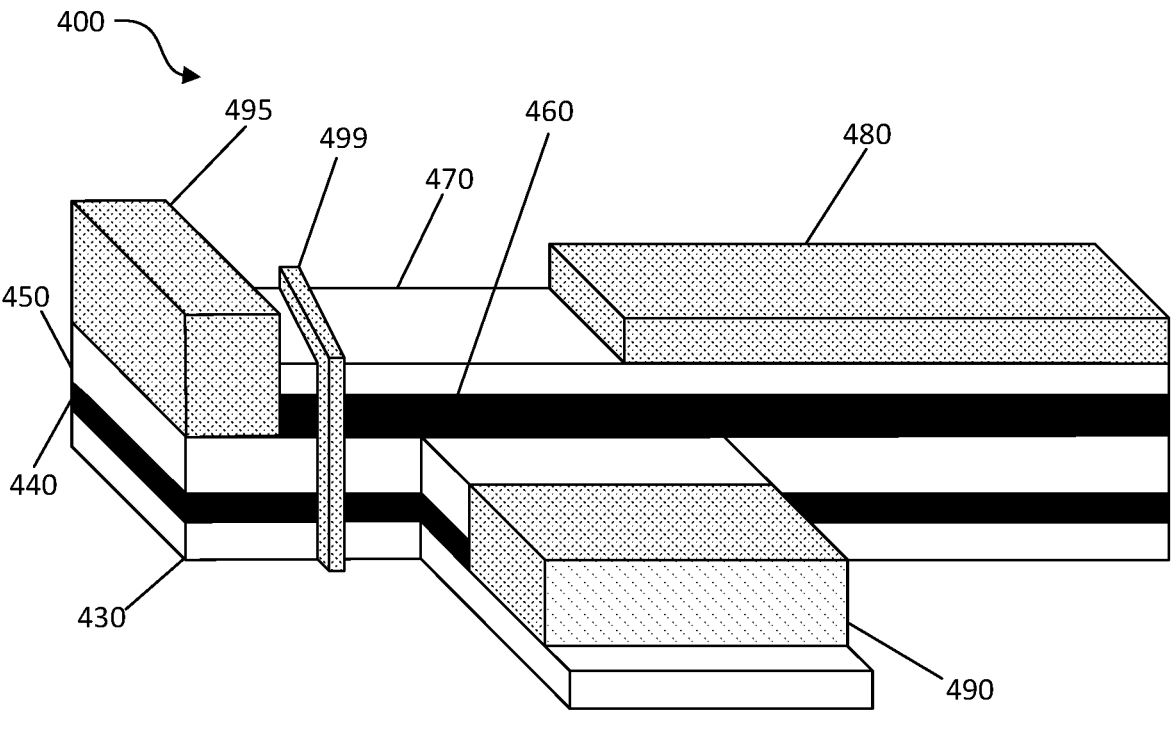
FIG. 4 is a perspective view of an example semiconductor device including a second example set of electrical contacts.

A second example arrangement of electrical contacts is shown in FIGS. 4 and 5. FIG. 4 is a schematic perspective view of a region at one end of an example device 400, and FIG. 5 is a schematic plan view of the device 400.

Similar to the FIG. 1 device, the example device 400 includes a gating layer 440 and a quantum well 460 sandwiched by lower, intermediate, and upper barriers 430, 450, 470. A superconductor component 480 is arranged on the upper barrier 470 and over the quantum well 460.

The example device 400 differs from device 300 in that one end of the nanowire is branched, and splits into two limbs 402, 404. As shown in FIG. 5, the nanowire includes a section resembling a 'T' junction when viewed in plan. The first electrical contact 490 for the gating layer 440 connects to the first limb 402 of the nanowire, and the second electrical contact 495*a* for the quantum well 460 connects to the second limb 404 of the nanowire.

To allow for easier connection to the gating layer 440, the upper barrier 470, and quantum well 460 may be removed selectively from the first limb 402, for example by etching.

Arranging the electrical contacts on different limbs of a branched nanowire is one technique for avoiding a short circuit. In addition, this arrangement allows the inclusion of a cutter gate 499 which may be operated to deplete the quantum well 460 selectively while allowing the gating layer 440 to continue to operate as a gate electrode.

The cutter gate 499 is arranged on the second limb 404 of the branched nanowire. The first electrical contact 490 on the first limb 402 is downstream of the cutter gate 499. Cutter gate 499 is illustrated as a strip of material. In practice, a gate dielectric for preventing flow of current from the cutter gate would be arranged between the cutter gate 499 and the remaining components of the device. Cutter gate 499 may be a wrap-around gate as illustrated, or may take any other appropriate form.

In use, the cutter gate 499 may be operated to isolate the quantum well 460 from the electrical contact 495. Due to the placement of the cutter gate 499 on the limb of the nanowire, this may be achieved without at the same time isolating the gating layer 440 from the first electrical contact 490. This allows the cutter gate and gating layer to be operated separately and independently from one another.

Similar to the device 300, a further electrical contact 495b for the quantum well 460 may be provided at an opposite end of the nanowire.

Various modifications may be made to the illustrated structure.

The branch 402 bearing the first electrical contact 490 is illustrate as being near an end of the nanowire. However, branch 402 may be at any point along the length of the nanowire provided that the branch 402 is on an opposite side of the cutter gate from the second electrical contact.

The illustrated example has a single cutter gate 499. A further cutter gate may be arranged between the further electrical contact 495b and the branch 402.

The illustrated branch takes the form of a T junction, however the angle between the branch and the length of the nanowire is not necessarily a right-angle and may be selected as appropriate.

Also provided herein is a method of operating the semiconductor device. In implementations where the device includes a superconductor component, the device may be cooled to an operating temperature of the semiconductor component for example using an appropriate cryogenic chamber. A magnetic field may be applied to the device. An electrostatic potential is applied to the gating layer. This causes the gating layer to behave as a gate electrode, for gating at the quantum well. Useful quantum states, e.g. Majorana zero modes, may be generated in the quantum well. Measurements may be performed on the quantum well. The device may be used as a component of a qubit device, for example.

An example method of manufacturing a semiconductor device as provided herein will now be explained with reference to FIG. 6. FIG. 6 is a flow diagram outlining the method.

The method comprises fabricating the semiconductor components of the device using selective area growth, and then performing any desired post-fabrication operations such as, for example, adding electrical contacts and forming a superconductor component.

At block 601, a mask is formed over a crystalline substrate. The mask has at least one opening, defining an area in which the semiconductor components will be grown. The mask may be formed by any appropriate technique. Typically, masks are formed by a lithographic process such as electron beam lithography.

Forming a mask using electron beam lithography comprises applying a layer of a resist to the crystalline substrate, for example by spin-coating; selectively exposing areas of the resist to an electron beam; and then developing the resist to form the mask.

Subsequently, the various layers of the semiconductor device are grown sequentially in the area defined by the opening in the mask. The layers may be grown by molecular beam epitaxy, metal-organic vapor phase epitaxy ("MOVPE"), or any other suitable process for epitaxially growing crystalline materials.

Each of the growth operations may be performed in the same growth chamber. The substrate may be maintained in the same growth chamber until all of the growth steps have been completed. In other words, the substrate is preferably not exposed to the atmosphere between growth steps. This may improve the quality of the interfaces between layers, thereby avoiding the creation of charge traps. Charge traps may degrade the performance of the device. It has been found that when a bottom gate is formed before forming the mask, e.g., as a buffer layer which covers the entire surface of the substrate, charge traps are created.

The growth operations include, at block 602, growing a lower barrier portion of the nanowire in the area defined by the opening in the mask. This step may optionally be preceded by an operation of growing a buffer layer in the opening. In implementations where the lower barrier includes multiple layers of materials, each layer is deposited in series.

At block 603, a gating layer is grown over the lower barrier.

Then, at block 604, an intermediate barrier is grown over the gating layer. Like the operations of block 602, in implementations where the intermediate barrier is to include a plurality of layers, the intermediate barrier is built up layer-by-layer.

A quantum well is then grown over the intermediate barrier, at block 605.

Subsequently, at block 606, an upper barrier may be grown over the quantum well. The upper barrier may include a plurality of layers of materials, similar to the lower and intermediate barriers, or may be a single layer.

After growing the semiconductor components, a superconductor component may be fabricated over the nanowire. For example, a layer of superconductor may be deposited globally over the surface of the substrate, and then selectively etched to pattern the desired superconductor components from the layer of superconductor. The deposition may be performed in the same chamber as the growth steps, or may be performed using a different apparatus. In some implementations, the chamber may be a vacuum chamber. In such implementations, the substrate may be maintained under vacuum until after depositing the superconductor material.

Electrical contacts and/or additional gate electrodes may be then added to the device. In implementations where the device comprises a superconductor component, the electrical contacts and/or gate electrodes may be formed at the same time as the superconductor component, or may be forming from a non-superconductive metal such as gold. Before forming the electrical contacts, portions of the nanowire may be selectively etched to allow for easier access to the gating layer and the quantum well, for example to form the arrangements shown in FIGS. 3 and 4. In implementations where more than one material is to be removed, the etching may comprise a plurality of sequential etching steps.

It will be appreciated that the above embodiments have been described by way of example only.

More generally, according to one aspect disclosed herein, there is provided a semiconductor device comprising a crystalline substrate and a nanowire arranged epitaxially on the crystalline substrate. The nanowire comprises a gating layer; a quantum well arranged over the gating layer; an intermediate barrier arranged between the gating layer and the quantum well; and an upper barrier arranged over the quantum well. By including a gating layer in the nanowire, it is made possible to bottom-gate the quantum well without requiring modification of the substrate. Allowing for bottom gating without modifying the substrate may make possible a wider range of circuit designs, since an insulating substrate may be used.

The gating layer may be a quantum well.

The nanowire may be a selective-area-grown nanowire. The nanowire may have a perimeter which is surrounded by a mask. The mask may be a hard mask. Circuitry may be arranged between the surface of the substrate and the mask.

The semiconductor device may further comprise a superconductor component arranged over the upper barrier. Incorporating a superconductor component into the device may allow interesting quantum mechanical behaviour to be induced in the device. For example, in some implementations, Majorana zero modes may be generated in the quantum well. In particular, the device may include a superconductor component in implementations where the device is incorporated into a qubit device.

The semiconductor device may further comprise a lower barrier arranged between the crystalline substrate and the gating layer. This may allow improved electronic properties to be obtained. The lower barrier may include two or more layers, of two or more different materials. Forming the lower barrier from two or more layers may provide defect filtering.

A buffer layer may be arranged between the crystalline substrate and the lower barrier. The buffer layer may allow the lower barrier to be grown more easily.

The intermediate barrier may comprise layers of at least two different materials. By configuring a barrier as a multi-layered structure, the electronic properties of the barrier may be improved. For example, the use of two or more layers may provide defect filtering.

In addition to the gating layer, which allows bottom gating of the quantum well, the semiconductor device may further comprise additional gate electrodes. For example, the device may include a top gate, by arranging a gate stack over the nanowire. Alternatively or additionally, the semiconductor device may further comprise a side gate.

The semiconductor device may further comprise a first electrical contact connected to the gating layer; and a second electrical contact connected to the quantum well. A third electrical contact may also be connected to the quantum well, for example at an opposite end of the nanowire to the second electrical contact. The gating layer is for applying an electrostatic field to the quantum well, and may have exactly one electrical contact.

The nanowire may be branched and may have first and second limbs. The first electrical contact may connect at the first limb, and the second electrical contact may connect at the second limb. In such implementations, the semiconductor device may further comprise a cutter gate for electrically depleting the quantum well, the cutter gate being configured to gate the second limb. This configuration allows the quantum well to be isolated from its electrical contact whilst at the same time allowing the gating layer to continue to operate independently as a gate electrode.

The cutter gate may be a wrap-around gate. A wrap-around gate may provide improved gating, since an electrostatic field may be applied from more than one face of the nanowire.

A related aspect provides a method of operating the semiconductor device. The method comprises applying an electrostatic potential to the gating layer, whereby the gating layer acts as a gate electrode for gating the quantum well. The configuration of the nanowire allows the gating layer to operate as a bottom gate for gating the quantum well.

Another aspect provides the use of a semiconductor layer to gate a quantum well, wherein the semiconductor layer is under the quantum well, and an intermediate barrier is present between the semiconductor layer and the quantum well, the intermediate barrier comprising a layer of a further semiconductor. The semiconductor layer, quantum well, and intermediate barrier may each be components of a nanowire. The use may be in the context of a device as described herein.

A still further aspect provides a method of fabricating a semiconductor device. The method comprises forming a mask over a crystalline substrate, the mask having an opening defining an area for growing a nanowire; and subsequently growing a nanowire epitaxially on the crystalline substrate in the area. In other words, the nanowire is grown by selective area growth. Growing the nanowire comprises:

growing a lower barrier over the substrate;

growing a gating layer over the lower barrier;

growing an intermediate barrier over the first quantum well growing a quantum well over the intermediate barrier; and growing an upper barrier over the quantum well.

The growing operations may be performed in a single growth chamber. The substrate may be kept in the growth chamber until the growing operations are completed. For example, in implementations where the nanowire is grown in a vacuum chamber, the nanowire may be kept under vacuum at least until the growth of the nanowire is completed. Avoiding exposure of the substrate to the open atmosphere may avoid contamination, which may allow higher-quality interfaces between layers to be obtained. For example, the formation of charge traps may be avoided. This may improve the operating characteristics of the finished device.

The method may further comprise fabricating any of the further elements described herein with reference to the device aspect. For example, the method may further comprise forming a superconductor component over the upper barrier.

The mask may be configured such that the nanowire is branched and includes first and second limbs. The method may further comprise, after growing a nanowire, selectively etching the first limb of the nanowire to expose a portion of the gating layer.

The components of the nanowire may be grown by any appropriate process. For example, the nanowire may be grown by molecular beam epitaxy.

Other variants or use cases of the disclosed techniques may become apparent to the person skilled in the art once given the disclosure herein. The scope of the disclosure is not limited by the described embodiments but only by the accompanying claims.

The invention claimed is:

1. A semiconductor device, comprising:

a crystalline substrate; and a nanowire arranged epitaxially on the crystalline substrate;

wherein the nanowire comprises:

a gating layer arranged over the substrate;

a quantum well arranged over the gating layer;

an intermediate barrier arranged between the gating layer and the quantum well; and an upper barrier arranged over the quantum well.

2. The semiconductor device according to claim 1, wherein the nanowire is a selective-area-grown nanowire having a perimeter which is surrounded by a mask.

3. The semiconductor device according to claim 2, wherein circuitry is arranged between the substrate and the mask.

4. The semiconductor device according to claim 1, further comprising a lower barrier arranged between the crystalline substrate and the first quantum well.

5. The semiconductor device according to claim 1, further comprising a superconductor component arranged over the upper barrier.

6. The semiconductor device according to claim 1, wherein the gating layer is a quantum well.

7. The semiconductor device according claim 1, wherein the intermediate barrier comprises layers of at least two different materials.

8. The semiconductor device according to claim 1, further comprising a gate stack arranged over the nanowire.

9. The semiconductor device according to claim 1, further comprising a side gate.

10. The semiconductor device according to claim 1, further comprising:

a first electrical contact connected to the gating layer; and a second electrical contact connected to the quantum well.

11. The semiconductor device according to claim 10, wherein the nanowire is branched and has first and second limbs, and wherein the first electrical contact connects at the first limb and the second electrical contact connects at the second limb.

12. The semiconductor device according to claim 11, further comprising a cutter gate for electrically depleting the quantum well, the cutter gate being configured to gate the second limb.

13. The semiconductor device according to claim 12, wherein the cutter gate is a wrap-around gate.

14. The semiconductor device according to claim 10, further comprising a third electrical contact connected to the quantum well.

15. A method of operating the semiconductor device, wherein the semiconductor device comprises:

a crystalline substrate; and a nanowire arranged epitaxially on the crystalline substrate;

wherein the nanowire comprises:

a gating layer arranged over the substrate;

a quantum well arranged over the gating layer;

an intermediate barrier arranged between the gating layer and the quantum well; and an upper barrier arranged over the quantum well;

which method comprises:

applying an electrostatic potential to the gating layer, whereby the gating layer acts as a gate electrode for gating the quantum well.

16. A method of fabricating a semiconductor device, which method comprises:

forming a mask over a crystalline substrate, the mask having an opening defining an area for growing a nanowire; and subsequently growing a nanowire epitaxially on the crystalline substrate in the area;

wherein growing the nanowire comprises:

growing a lower barrier over the substrate;

growing a gating layer over the lower barrier;

growing an intermediate barrier over the gating layer;

growing a quantum well over the intermediate barrier; and growing an upper barrier over the quantum well.

17. The method according to claim 16, wherein all of the growing operations are performed in a single growth chamber.

18. The method according to claim 16, further comprising forming a superconductor component over the upper barrier.

19. The method according to claim 16, wherein the mask is configured such that the nanowire is branched and includes first and second limbs, and wherein the method further comprises, after growing a nanowire, selectively etching the first limb of the nanowire to expose a portion of the first quantum well.

20. The method according to claim 16, wherein the nanowire is grown by molecular beam epitaxy.

* * * * *